US006977517B2

United States Patent
Miao et al.

(10) Patent No.: US 6,977,517 B2
(45) Date of Patent: Dec. 20, 2005

(54) LASER PRODUCTION AND PRODUCT QUALIFICATION VIA ACCELERATED LIFE TESTING BASED ON STATISTICAL MODELING

(75) Inventors: Song Miao, Sunnyvale, CA (US); Chun Lei, Los Gatos, CA (US); Raj Cornelius, Los Altos, CA (US); Alex Klajic, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 213 days.

(21) Appl. No.: 10/440,743

(22) Filed: May 19, 2003

(65) Prior Publication Data

US 2004/0023422 A1 Feb. 5, 2004

Related U.S. Application Data
(60) Provisional application No. 60/382,423, filed on May 20, 2002.

(51) Int. Cl.[7] ............................................. G01R 31/26
(52) U.S. Cl. ...................................... 324/767; 324/765
(58) Field of Search .................. 324/73.1, 765–769, 324/158.1; 438/14, 17–18; 703/2, 13–14, 20

(56) References Cited

U.S. PATENT DOCUMENTS

| | | | | |
|---|---|---|---|---|
| 4,573,255 A | * | 3/1986 | Gordon et al. | ................. 438/15 |
| 5,617,036 A | * | 4/1997 | Roff | ............................ 324/760 |
| 5,872,881 A | | 2/1999 | Rossi et al. | |
| 2003/0074173 A1 | | 4/2003 | Monroe | |

OTHER PUBLICATIONS

Pamphlet for 2.5 G 1310 nm Fabry–PPerot Laser Diode, *Demeter Technologies, Inc.,* Jan. 11, 2002.
*Strained Multi Quantum Well (SMQW) Laser Diode, Reliability Data,* Agilent Technologies, 2000, no month.
News Release, *Nortel Networks Announces Industry's First Telcordia–Qualified Widely tunable Laser,* Apr. 30, 2002, www.nortelnetworks.com/corporate/news/newsrelease/2002b/04_30_02_m120_tunable_laster.html.

* cited by examiner

*Primary Examiner*—Minh N. Tang
(74) *Attorney, Agent, or Firm*—Workman Nydegger

(57) ABSTRACT

A method is provided for improving performance testing in semiconductor lasers via an accelerated life model. By using an accelerated life model, operating conditions for performance tests, such as burn-in procedures and wafer qualification, are optimized with reduced cost and effort. The method is also used to improve maintenance of optical networks containing semiconductor lasers.

12 Claims, 8 Drawing Sheets

Failure Rate vs Time

US 6,977,517 B2

LASER PRODUCTION AND PRODUCT QUALIFICATION VIA ACCELERATED LIFE TESTING BASED ON STATISTICAL MODELING

RELATED APPLICATION

This invention claims priority under 25 U.S.C. § 119(e) from U.S. provisional application Ser. No. 60/382,423 filed on May 20, 2002.

BACKGROUND OF THE INVENTION

1. The Field of the Invention

This application relates to performance and reliability testing of laser diodes and other semiconductor lasers.

2. The Relevant Technology

Laser diodes and other semiconductor lasers are an essential component of many current technologies. In many applications, such as optical network devices, the lasers must operate with high reliability in order to provide continuous operation while minimizing maintenance time and expense.

One common characteristic of many semiconductor lasers is a particular shape for the lifetime curve of the device. Many semiconductor lasers exhibit a 'bathtub' curve for average lifetime, as shown in FIG. 1. The bathtub curve shape arises for devices that have a high 'infant mortality' rate, where a substantial number of devices fail after a relatively short period of use due to manufacturing defects.

As a response to the bathtub shaped failure curve, semiconductor lasers are typically subjected to performance testing in the form of a 'burn-in' procedure. During a burn-in procedure, the laser is operated at a specific current and temperature for a fixed duration. The laser is then tested to see if it is still performing within desired specifications. Performing burn-in allows flawed devices to be identified before they are incorporated into larger product assemblies or shipped to customers. This leads to increased reliability for the remaining lasers that are incorporated into products in the field. The operating conditions for a burn-in procedure are selected to identify lasers that exhibit early failure while minimizing the stress on the other properly manufactured lasers. The operating conditions for a burn-in procedure are typically developed by trial and error, and finding a desirable set of operating conditions may take up to a year of testing or longer. A key consideration in developing burn-in procedures is to find the operating conditions that optimize the burn-in time or cost while still capturing all of the units that would fail burn-in. That is, a goal is to minimize the time and/or expense necessary to get to point $t_0$ on the bathtub curve shown in FIG. 1, where further testing does not identify any additional early failing units.

Another common form of performance testing is wafer qualification. For lasers with high infant mortality rates, such as most laser diodes, every device manufactured will be subjected to burn-in, as the goal is to identify flawed devices. Wafer qualification, on the other hand, is performed on a small sampling of the total devices produced. During wafer qualification, one or more representative die from a processed wafer are placed in a test apparatus for extended life testing of the device. The sample devices are tested to verify that no variations have occurred in the manufacturing process that would lead to impaired performance for other devices in same production batch. Developing appropriate operating conditions for wafer qualification is also a time consuming process.

Because of the difficulties in developing operating conditions for performance tests, device manufacturers typically develop a minimal number of operating conditions for each type of performance test. This limits flexibility during the manufacturing process, as these time consuming and costly procedures cannot be optimized to improve productivity.

One method for collecting additional information about desirable operating conditions for performance testing, including burn-in and wafer qualification, is via "Life Data Analysis." Traditional "Life Data Analysis" involves analysis of time-to-failure data obtained under selected operating conditions in order to quantify the life characteristics of the product. Such life data, however, is difficult to obtain for products with long expected lifetimes. This difficulty, combined with the need to observe failures of products to better understand their life characteristics, has led to the development of methods to force such long-lived products to fail more quickly. In other words, these methods attempt to accelerate the failure rate through the use of high stress conditions.

Analysis of data from such accelerated life testing can yield valuable information regarding product life as a function of design conditions, but only if the 'accelerated' conditions of the failure test can be properly correlated with operating conditions during normal use. In order to correlate the 'accelerated' and typical operating conditions, the accelerated life must incorporate the correct variable dependencies, such as the dependence of laser lifetime on the junction temperature of the laser diode.

Characterizing expected device lifetimes is also becoming increasingly important for the development and characterization of end-user products. For example, previous generations of optical networks often made use of transceivers that were cooled to maintain desired operating conditions. Newer generations of this technology, however, are moving toward uncooled transceivers. Due to the high reliability requirements of optical networks, understanding device lifetimes is important both for identifying the level of redundancy required in the system as well as for developing maintenance schedules.

Therefore, there is a need for an improved method of establishing operating conditions for burn-in, wafer qualification, and other performance test procedures. The method should facilitate identification of equivalent performance test operating conditions once baseline conditions have been established empirically. The method should incorporate life data from accelerated life testing for developing procedure parameters. The method should allow for correlation of performance testing conditions with typical device operating conditions in one or more desired applications. Additionally, the method should allow for characterization of device lifetimes under various operating conditions in order to assist with the design and maintenance of applications involving the device.

SUMMARY OF INVENTION

The present invention provides a method for carrying out performance tests under operating conditions selected based on an accelerated life model. This is accomplished by using the accelerated life model to identify operating conditions equivalent to a known set of empirically derived performance test conditions. In an embodiment, an initial set of performance test operating conditions for a device is determined by empirical testing. An accelerated life model is then used to identify alternative performance test operating conditions that will lead to a substantially equivalent performance test. These performance test conditions may be selected to optimize the time or cost of performance testing, or to satisfy another manufacturing constraint. In an embodiment, the accelerated life model includes a dependence on both temperature and operating current. One or more devices are then subjected to performance testing at the selected conditions.

The present invention also provides a method for developing operating conditions for performance testing by constructing an accelerated life model to allow for performance testing under optimized conditions. In an embodiment, semiconductor lasers are subjected to stress testing under a variety of test conditions. The failure rate of the lasers is collected and the data is used to construct a statistical failure model. The failure model is then used to fit parameters for an accelerated life model. After developing the accelerated life model, the model may be used to identify various performance testing operating conditions that will result in equivalent stress on a semiconductor laser. The laser is then subjected to performance testing at a selected set of operating conditions.

Additionally, the present invention provides a method for designing and maintaining optical networks and other products that utilize semiconductor lasers. In an embodiment, operating conditions and reliability requirements are specified for an optical network or other system involving semiconductor lasers. An accelerated life model is used to predict expected lifetimes for the lasers. Based on the operating conditions, reliability requirements, and expected lifetimes, the optical network or other system is designed to incorporate appropriate levels of redundancy to insure continuous performance while reducing costs. Alternatively, a maintenance program is developed to achieve the same goals.

DETAILED DESCRIPTION OF THE PREFERRED EMBODIMENTS

Figure 1:
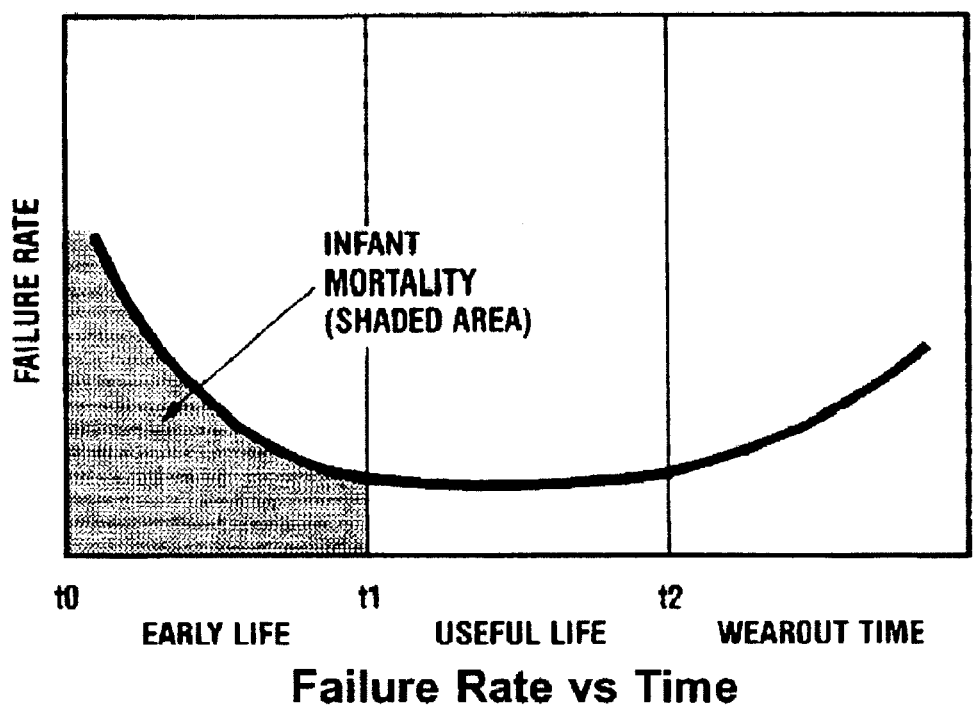
FIG. 1 depicts a typical bathtub-shaped lifetime curve for a semiconductor laser.

Laser diodes are an example of a product that may be improved or optimized by selecting optimized performance test conditions via accelerated life testing. Examples of laser diodes that may be improved by this invention include 1.3 $\mu$m Fabry-Perot (FP) laser diodes produced by Demeter Technologies, Inc. of El Monte, Calif. [hereinafter "Demeter"]. Specific laser diodes available from Demeter include model 900017, which is a laser diode suitable for short and medium distance optical fiber communication applications involving up to 2.5 gigabits per second operation at up to 85° C. These laser diode chips use a strained layer multi-quantum well (MQW) structure based on the InGaAlAs material system. The name derives from the way the laser cavity is grown. Typical spectral widths for these laser diodes are on the order of 3 to 6 nm. The laser chip is a ridge waveguide (RWG) structure with HR/AR facet coatings. The design is optimized for high-speed operation in an epi-up configuration. These high speed laser diodes are suitable for a variety of applications, including transceiver applications.

For many semiconductor lasers, a suitable accelerated life model includes dependence on both the temperature and the drive current of the laser. A detailed discussion of how to develop such a model will be presented below, after a general discussion of the nature of the accelerated life model. In an embodiment, the model takes the general form of $$\text{Median Life} = A * F(I) * \exp\left(\frac{E_a}{kT}\right) \quad (1)$$

Where I=drive current (mA)
T=junction temperature (Kelvin)
A=process dependent constant
$E_a$=activation energy (eV)
k=Boltzmann's constant, 8.16171*10$^{-5}$ eV per ° C.
and F(I) is a function of current, such as $(1/I)^B$ or another relation to one. Note that previous efforts to model the lifetime behavior of semiconductor lasers have not included an explicit dependence on operating current. Explicit inclusion of a dependence on current in the lifetime model is essential for application of the model to semiconductor lasers. Those skilled in the art will recognize that models similar to equation (1) above may be applied to a variety of laser diodes and laser systems, such as 1.3 um and 1.5 um FP laser diodes.

Once an accelerated life model has been developed, it can be used for a variety of applications. One potential application is optimization of performance testing conditions, such as operating conditions for burn-in or wafer qualification for semiconductor lasers. As mentioned above, developing burn-in, wafer qualification, or other performance testing conditions is a time consuming process. However, these performance tests are a necessary part of the manufacturing process for many semiconductor lasers due to the need for high reliability during operation. Under traditional methods of laser manufacturing, once operating conditions for a particular performance test have been established the conditions cannot be varied, as the purpose of the performance testing is to guarantee reliability. Thus, performance test operating conditions are typically not modified once a first set is established.

The methodology provided by the present invention allows for a way to modify performance test operating conditions without having to repeat the development process for a new set of operating conditions. Once a first set of operating conditions have been developed for burn-in, wafer qualification, or another performance test, the accelerated life model may be used to identify equivalent operating conditions that are optimized to match a desired time, cost, or other manufacturing consideration. As a result, burn-in conditions may be selected that allow for full identification of initially flawed devices while minimizing the amount of the effective device life consumed during the procedure. Similarly, accelerated aging test data may be used to select wafer qualification conditions resulting in thorough, accurate device testing in a greatly reduced time. In an embodiment, the accelerated life model may be used to change the duration of a performance test by using the accelerated life model to determine the 'acceleration factor' resulting from modifying other operating conditions, such as the operating temperature or the operating current.

Figure 2:
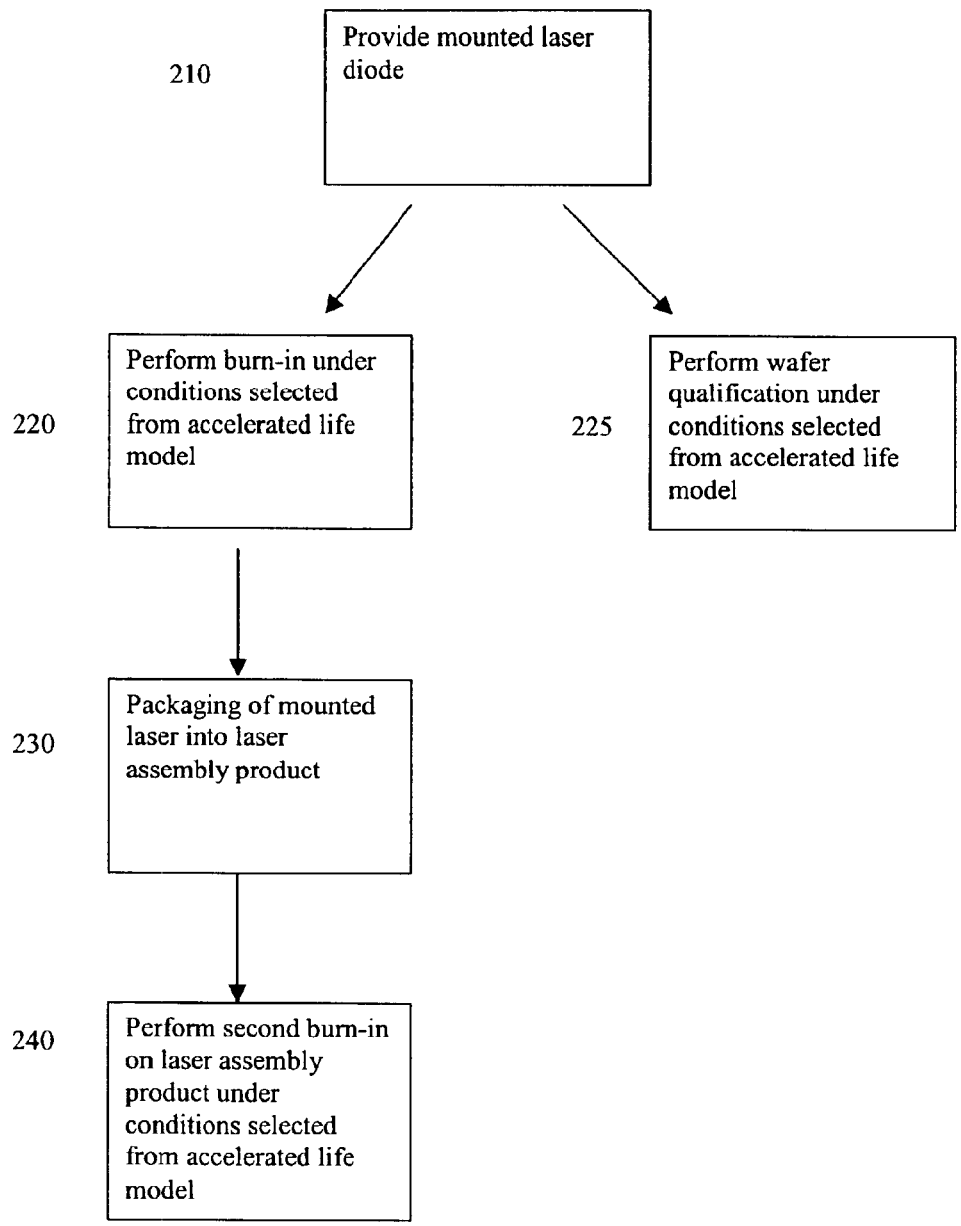
FIG. 2 depicts a flow chart of a portion of a laser manufacturing process related to performance testing in an embodiment of the present invention.

FIG. 2 provides an embodiment of the application of the present invention in a production environment. FIG. 2 begins toward the end of the production process with providing 210 a processed wafer die containing a laser. The laser is mounted on a TO header or other suitable mount to allow connection of the laser to other circuitry. Some of these lasers are designated for wafer qualification, and are subjected 225 to wafer qualification using conditions selected through use of the accelerated life model. Use of the accelerated life model allows for reduction of the total wafer qualification time while retaining confidence in the adequacy of the wafer qualification test. Briefly, the temperature and operating current values for the identified operating conditions and the model operating conditions are inserted into equation 1. The resulting equations at the two sets of conditions may be expressed as a multiplicative ratio describing how the median life changes when operating at the two conditions. This ratio, referred to as an acceleration factor, reflects the change in operating time required to subject the laser to an equivalent amount of stress at the two different operating conditions.

For the remaining lasers, after suitable mounting the laser is subjected to burn-in 220. Once again, the conditions for burn-in are selected by using an accelerated life model, allowing for reliable burn-in in a shorter time period. Lasers that survive burn-in are then incorporated into larger products such as transceivers or other laser assemblies during packaging 230. After packaging, the laser may be subjected to a second burn-in 240. Typically this secondary burn-in is at a lower stress condition to test other components in the packaged assembly. However, if the conditions of the second burn-in are designed to further test the laser diode as well, this second burn-in may also be optimized using the present invention. In another embodiment, the first burn-in may be performed after incorporation of the laser diode into a laser assembly product.

Those skilled in the art will recognize that this method for incorporating an accelerated life model into performance testing has additional applications. For example, once a suitable accelerated aging model has been developed, it can be distributed or sold to others, such as by incorporation in software sold as part of an automatic test apparatus. A user of the test apparatus would have the flexibility to specify desired burn-in or wafer qualification tests. In this embodiment, a desired burn-in procedure could be entered for a first set of temperature and current conditions. The user could then request that the apparatus determine an equivalent burn-in procedure that required a shorter burn-in time, or the fastest equivalent burn-in procedure that did not exceed a particular current level.

Other embodiments of the present invention relate to the maintenance of systems that incorporate semiconductor lasers. In some embodiments, the present invention may be used in the maintenance of optical networks. By using the model, the available expected lifetime of semiconductor lasers within the network may be calculated, thus allowing for improved maintenance of the network. This improvement may be in the form of an improved maintenance schedule, allowing for the maximum amount of time between replacement of laser assemblies without unduly jeopardizing network performance. Alternatively, the improvement may come in the form of optical networks with the intelligence to request maintenance when the likelihood of failure for lasers within the network becomes too high based on their operational history.

Figure 3:
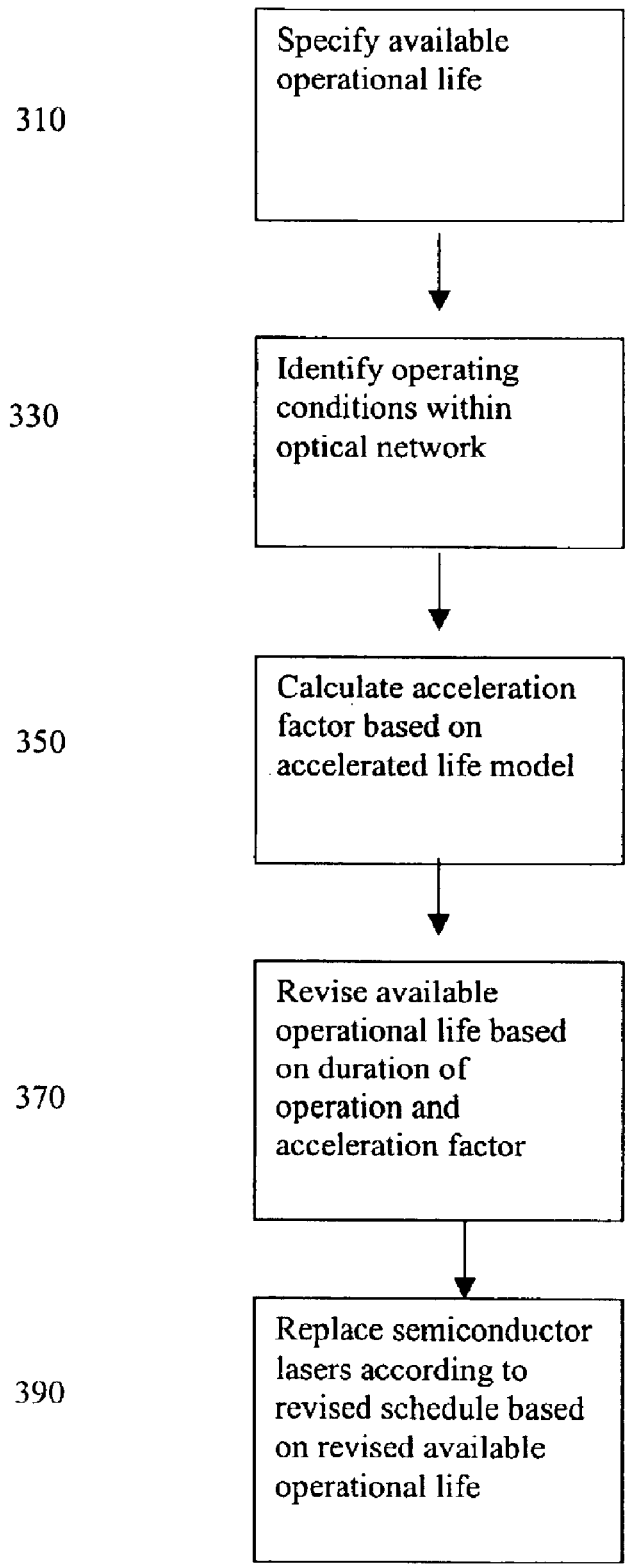
FIG. 3 depicts a flow chart of an embodiment where the present invention is used for design of an optical network.

FIG. 3 provides a flow chart of an embodiment where the present invention is used for design of an optical network. The process begins with specifying 310 the available operational life of the semiconductor laser. In an embodiment, the available operational life may represent the initial expected lifetime of a semiconductor laser after burn-in and incorporation into the optical network. This initial expected lifetime will be based on a model set of operating conditions for the laser, such as a temperature and operating current. In another embodiment, the available operational life also includes information calculated based on the operational history of the laser. In such an embodiment, the previous operating conditions, including the duration of time spent at each operating condition, may be tracked and accumulated for this calculation. After specifying the available operational life, the operating conditions in the optical network are identified 330. In an embodiment, this may represent a forward-looking prediction of expected operating conditions within the optical network. In another embodiment, the operating conditions are identified in real time. In this latter embodiment, at least some of the operating conditions encountered by the semiconductor laser are monitored during operation. Next, an acceleration factor is calculated 350. Using the acceleration factor, a revised available operational life may be calculated 370. In embodiments where the identified operating conditions are forward-looking predictions, determining the revised available operational life may require relatively few calculations. For example, if the identified operating conditions are specified to be constant during operation of the optical network, then only one acceleration factor needs to be determined. The available operational life may then be multiplied by this acceleration factor to yield the revised value. In other embodiments, the identified operating conditions may be measured as they occur. In such embodiments, there are several ways to develop revised available operational lifetimes. For example, the operating history of the semiconductor laser may be recorded so that the available operational lifetime may be calculated at fixed intervals. Alternatively, the calculation could be done in real time, with the available operational lifetime being constantly updated during operation of the optical network. Other embodiments will be apparent to those of skill in the art. By obtaining revised available operational lifetimes for the semiconductor lasers in an optical network, the maintenance of the network may be improved by revising 390 the maintenance schedule in step. In embodiments where the revised lifetime is based on forward-looking calculations, the revised maintenance schedule may be developed ahead of time. In other embodiments where the available operational lifetime is revised based on monitoring the actual operating conditions, the revised maintenance schedule may represent a signal generated by the optical network requesting service. In such embodiments, the signal could be generated, for example, when the available operational lifetime of a semiconductor laser within the network falls below a threshold value.

In order to obtain the benefits of using an accelerated life model for a given type of semiconductor laser, at some point parameters for the model must be developed based on experimental data. One method for obtaining the necessary experimental data for an accelerated life model is through accelerated aging tests. During accelerated aging tests, groups of semiconductor lasers are subjected to operating conditions involving various temperatures and currents. Failures within the semiconductor lasers are tracked, and the failure data is used to construct an accelerated life model.

The results of extensive reliability testing via long term accelerated aging tests are summarized below. This includes a working example of the procedure for constructing a failure model, a summary of raw data used for constructing an example of a failure models, and how parameters are determined for a sample thermodynamic lifetime model, or accelerated life model. This sample accelerated life model is then used to determine various time, temperature, and current combinations that produce equivalent burn-in and wafer qualification times for a device.

Figure 4:
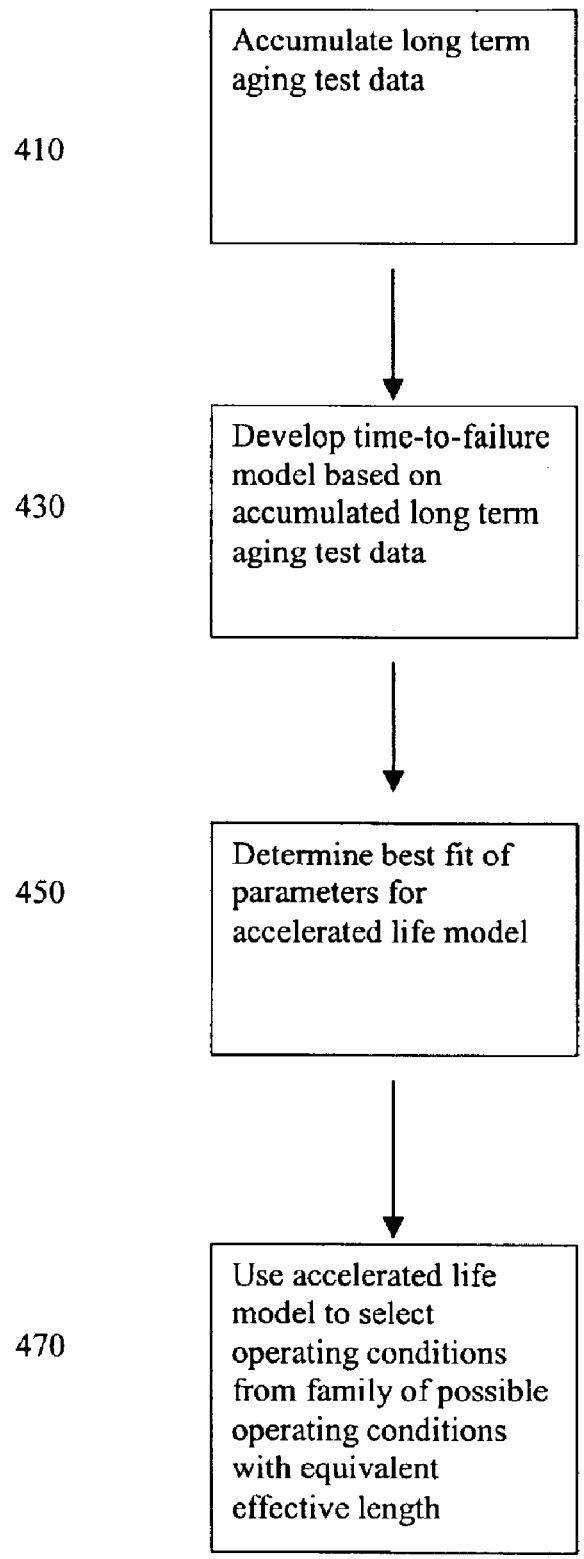
FIG. 4 depicts a flow chart for the development of an accelerated life model according to an embodiment of the present invention.

FIG. 4 provides an overview of the development of an accelerated life model. During data accumulation 410, long-term aging test data is gathered for the device to be modeled. Typically this will involve gathering aging test data for a device at a number of operating conditions. This aging test data may then be used in failure analysis 430 to find parameters for fitting a time-to-failure probability distribution function, such as a Weibull or Lognormal distribution. These probability distribution functions can then be fit 450 to parameters for the accelerated life model. For example, the mean time to failure or median failure time may be calculated from the probability distribution function for each operating condition. The combination of median failure time and operating condition values, such as operation current and operation temperature, can then be used to fit the parameters of the accelerated life model. After fitting the parameters, the accelerated life model may be used to select 470 appropriate operating conditions for burn-in, wafer qualification, or other reliability testing procedure. The working example below will provide greater detail as to how to perform the steps involved in developing an accelerated life model.

Data Collection

In order to accumulate 410 accelerated aging data, a total of 270 FP lasers taken from normal production batches were subjected to stress tests in 9 groups of 30 units each at different levels of current and temperature. The temperatures and currents were chosen to generate significant failure mode acceleration over expected application operating conditions of up to 85° C. ambient temperature and approximately 25 mA average operating current. The devices in each group were taken from different processing lots.

The tests were conducted at constant current in environmental chambers operating at temperatures of 100° C., 125° C. and 150° C. The devices were loaded on burn-in boards and were driven at constant current levels of 62 mA, 100 mA and 146 mA. Periodically, the devices were removed from the burn-in chambers and tested at room temperature. Output power and threshold current readings were then obtained with the devices at 25° C. and 22 mA operating current.

For the devices involved in the accelerated aging tests, failure was defined as Change of Output Power>50% (3 dB drop or 1.76 dB increase) or Change of Threshold Current>50% (50% drop or 50% increasing). That is $$|\Delta Power/Power_{Initial}|>50\% \quad (2)$$

or $$|\Delta Ith/Ith_{Initial}|>50\% \quad (3)$$

It is important to note that all failures recorded were actual failures and not extrapolations to failure.

For each laser diode that failed under the criteria described in equations (2) and (3), the time-to-failure was recorded. Due to the nature of the test scheme, where devices were periodically removed from the burn-in test to determine their performance, the data is interval censored. As a result, the exact time-to-failure was not determined. Instead, the data indicates only that the failure occurred sometime during test intervals.

Table 1 provides a summary of the failure data collected for various aging conditions. As mentioned above, a failure was defined as a change of greater than 50% for either the output power or the threshold current of a device.

TABLE 1

Reliability study matrix of forward current and ambient temperatures employed.

| Group | Aging Conditions | Total Burn-In Hours To-Date | # Failures/# Samples |
|---|---|---|---|
| I | 150° C., 146 mA | 7100 | 26/30 |
| II | 150° C., 100 mA | 7100 | 16/30 |
| III | 150° C., 62 mA | 7100 | 4/30 |
| IV | 125° C., 146 mA | 7100 | 16/30 |
| V | 125° C., 100 mA | 7100 | 0/30 |
| VI | 125° C., 62 mA | 7100 | 0/30 |
| VII | 100° C., 146 mA | 7100 | 10/30 |
| VIII | 100° C., 100 mA | 7100 | 0/30 |
| IX | 100° C., 62 mA | 7100 | 0/30 |

Since only groups I, II, III, IV and VII have failures, the lognormal curve fitting and Weibull curve fitting was applied only to these groups. It would be possible to include groups V, VI, VIII, and IX in the data analysis by extending the length of the burn-in testing to cause a sufficient number of failures of devices in those groups.

Analysis of Failure Data Via Lognormal and Weibull Distributions

During failure analysis 430, the censored time-to-failure interval data for each group with suspensions (unfailed units) was analyzed. The time-to-failure data was fit to determine parameters for both a lognormal distribution and Weibull distribution for comparison purposes. By fitting the time-to-failure data to a suitable distribution, such as a lognormal or Weibull distribution, the median life for each group of failure data could be calculated.

The lognormal distribution is a more versatile distribution than the normal distribution as it has a range of shapes, and therefore is often a better fit to reliability data. The lognormal probability density function (p.d.f.) is $$f(x) = \frac{1}{(2\pi)^{1/2}\sigma x} \exp\left[-\frac{(\ln x - \mu)^2}{2\sigma^2}\right] \text{ (for } x \geq 0) \quad (4)$$

where $\mu$ and $\sigma$ are the mean and standard deviation (SD) of the lognormal data.

The mean (or mean-time-to-failure, MTTF), SD and median of the lognormal distribution are given by $$\text{Mean} = \exp\left(\mu + \frac{\sigma^2}{2}\right) \quad (5)$$

$$SD = [\exp(2\mu + 2\sigma^2) - \exp(2\mu + \sigma^2)]^{1/2} \quad (6)$$

$$\text{Median} = \exp(\mu) \quad (7)$$

The lognormal reliability function and failure rate are given by $$R(x) = \int_x^\infty f(t)dt \tag{8}$$

$$\lambda(x) = \frac{f(x)}{R(x)} \tag{9}$$

The parameters of the lognormal distribution can be estimated using Maximum Likelihood Estimation (MLE). This general log-likelihood function is composed of two summation portions:

$$\ln(L) = \tag{10}$$

$$\Lambda = \sum_{i=0}^{F} N_i \ln\left[\frac{1}{\sigma X_i}\phi\left(\frac{\ln(X_i) - \mu}{\sigma}\right)\right] + \sum_{j=1}^{S} M_j \ln\left[1 - \Phi\left(\frac{\ln(X'_j) - \mu}{\sigma}\right)\right]$$

where:
F is the number of groups of times-to-failure data points.
$N_i$ is the number of times-to-failure in the ith time-to-failure data group
$\mu$ is the mean of the natural logarithms of the time-to-failure
$\sigma$ is the standard deviation of the natural logarithms of the time-to-failure.
$X_i$ is the time of the ith group of time-to-failure data.
S is the number of groups of suspension data points.
$M_j$ is the number of suspension in ith group of suspension data points.
$X_j'$ is the time of the ith suspension data group.
The solution may be found by solving for a pair of parameters $(\hat{\mu}, \hat{\sigma})$ so that $$\frac{\partial \ln(L)}{\partial \mu} = 0 \tag{11}$$

and $$\frac{\partial \ln(L)}{\partial \sigma} = 0, \tag{12}$$

where $$\frac{\partial \ln(L)}{\partial \mu} = \frac{1}{\sigma^2}\sum_{i=1}^{F} N_i(\ln(X_i) - \mu) + \frac{1}{\sigma}\sum_{j=1}^{S} M_j \frac{\phi\left(\frac{\ln(x_j) - \mu}{\sigma}\right)}{1 - \Phi\left(\frac{\ln(x_j) - \mu}{\sigma}\right)} \tag{13}$$

$$\frac{\partial \ln(L)}{\partial \sigma} = \tag{14}$$

$$\sum_{i=1}^{F} N_i\left(\frac{(\ln(X_i) - \mu)^2}{\sigma^3} - \frac{1}{\sigma}\right) + \frac{1}{\sigma}\sum_{j=1}^{S} M_j \frac{\left(\frac{\ln(x_j) - \mu}{\sigma}\right)\phi\left(\frac{\ln(x_j) - \mu}{\sigma}\right)}{1 - \Phi\left(\frac{\ln(x_j) - \mu}{\sigma}\right)}$$

$$\phi(x) = \frac{1}{\sqrt{2\pi}} e^{-\frac{1}{2}x^2} \tag{15}$$

$$\Phi(x) = \frac{1}{\sqrt{2\pi}} \int_{-\infty}^{x} e^{-\frac{1}{2}t^2} dt \tag{16}$$

The collected failure data were also fit using a Weibull distribution. The Weibull distribution is advantageous for reliability work due to the fact that by adjusting the distribution parameters it can be made to fit many life distributions. The Weibulll p.d.f. is $$f(x) = \frac{\beta}{\eta^\beta} x^{\beta-1} \exp\left[-\left(\frac{x}{\eta}\right)^\beta\right] \text{ (for } x \geq 0) \tag{17}$$

where $\beta$ is the shape parameter and $\eta$ is the scale parameter, or characteristic life—it is the life at which 63.2 per cent of the population will have failed.

The mean (or MTTF) and median of Weibull distribution are given by $$\text{Mean} = \frac{\eta}{\beta}\Gamma\left(\frac{1}{\beta}\right) \tag{18}$$

$$\text{Median} = \eta\left(1 - \frac{1}{\beta}\right)^{\frac{1}{\beta}} \tag{19}$$

The Weibull reliability function and failure rate are given by $$R(x) = \int_x^\infty f(t)dt = \exp\left(-\frac{x}{\eta}\right)^\beta \tag{20}$$

$$\lambda(x) = \frac{f(x)}{R(x)} = \frac{\beta}{\eta}\left(\frac{x}{\eta}\right)^{\beta-1} \tag{21}$$

The parameters of the Weibull distribution can be estimated using Maximum Likelihood Estimation (MLE). This general log-likelihood function is composed of two summation portions:

$$\ln(L) = \Lambda = \sum_{i=0}^{F} N_i \ln\left[\frac{\beta}{\eta}\left(\frac{X_i}{\eta}\right)^{\beta-1} e^{-\left(\frac{x_i}{\eta}\right)^\beta}\right] + \sum_{j=1}^{S} M_j\left(\frac{X'_j}{\eta}\right)^\beta \tag{22}$$

where:
F is the number of groups of times-to-failure data points.
$N_i$ is the number of times-to-failure in the ith time-to-failure data group.
$\beta$ is the Weibull shape parameter.
$\eta$ is the Weibull scale parameter.
$X_i$ is the time of the ith group of time-to-failure data.
S is the number of groups of suspension data points.
$M_j$ is the number of suspension in ith group of suspension data points.
$X_j'$ is the time of the ith suspension data group.

The solution may be found by solving for a pair of parameters $(\hat{\beta}, \hat{\eta})$ so that $$\frac{\partial \ln(L)}{\partial \beta} = 0$$

and $$\frac{\partial \ln(L)}{\partial \eta} = 0,$$

where $$\frac{\partial \ln(L)}{\partial \beta} = \frac{1}{\beta}\sum_{i=1}^{F} N_i + \sum_{i=1}^{F} N_i \ln\left(\frac{X_i}{\eta}\right) - \sum_{i=1}^{F} N_i \left(\frac{X_i}{\eta}\right)^{\beta} \ln\left(\frac{X_i}{\eta}\right) - \sum_{j=1}^{S} M_j \left(\frac{X'_j}{\eta}\right)^{\beta} \ln\left(\frac{X'_j}{\eta}\right) \quad (23)$$

$$\frac{\partial \ln(L)}{\partial \eta} = \frac{-1}{\beta}\sum_{i=1}^{F} N_i + \frac{\beta}{\eta}\sum_{i=1}^{F} N_i \left(\frac{X_i}{\eta}\right)^{\beta} + \frac{\beta}{\eta}\sum_{j=1}^{S} M_j \left(\frac{X'_j}{\eta}\right)^{\beta} \quad (24)$$

Accelerated Life Model

For the Demeter 1.3 μm lasers studied in this working example, the model described above was used to describe 450 the degradation mechanism and time to failure:

$$\text{Median Life} = A * \left(\frac{1}{I}\right)^{B} \exp\left(\frac{E_a}{kT}\right) \quad (1)$$

where:

I=drive current (mA)
T=junction temperature (Kelvin)
A=process dependent constant
B=drive current acceleration constant
$E_a$=activation energy (eV)
k=Boltzmann's constant, $8.16171*10^{-5}$ eV per ° C.

After obtaining the median life for each group of failure data, an accelerated life model was derived by estimating the constants A, B and Ea in equation (3) from the lognormal and Weibull curves described above. Multivariable linear regression (a least squares fit) was used to estimate the parameters for the accelerated life model based on the data fit to the lognormal distribution. The results of the multivariable linear regression for determining the parameters of the accelerated life model based on the fit of the failure data to the lognormal distribution are presented below. Note that this analysis is based on the junction temperature of the laser. The junction temperature was determined using the relations $P_D=[0.9+6*I]*I$ $T_j=T_a+P_D*\theta_j$ Also, the thermal resistance was selected to be 200° C./W.

TABLE 2

Accelerated Life Model Using Lognormal Distribution

| A | B | Ea | Acceleration Factor |
|---|---|---|---|
| 0.05 | 1.67 | 0.76 | A.F. = $(I_{f1}/I_{f2})^{1.67}$*exp(Ea/k *(1/$T_{j2}$ − 1/$T_{j1}$)) Where Ea = 0.76 eV |

The combination of A, B and Ea resulting in the best curve fit occurs when A=0.05, B=1.67 and Ea=0.76. Typical values of Ea for the most of these types of lasers are between 0.6 and 1. Based on the above, Tthe predicted Median Life is:

Median Life=$0.05*(1/I)^{1.67}*\exp(Ea/k*(1/T))$ where $Ea$=0.76 eV.

In the lognormal distribution, the natural logarithm of the time-to-failure is distributed normally. The lognormal distribution has two parameters: μ, which is the mean of the natural logarithm of the failure times, and σ, which is the standard deviation of the natural logarithm of failure times. The MTTF for the lognormal distribution is given by $\exp(\mu+\sigma^2/2)$. The failure rate for the lognormal distribution is neither always increasing nor always decreasing. It takes different shapes, depending on the parameters μ and σ. Based on the collected failure data described above, fitting the data to a lognormal distribution resulted in a value of σ=1.64.

To confirm that the SD of the lifetime distributions had the same value for each of the test conditions resulting in failures, the likelihood ratio (LR) test was applied. The LR test statistic was 1.02. Under the null hypothesis that all SD parameters are equal, the chi square distribution has 4 degrees of freedom. Since $1.02<\chi^2(1-90\%, 4)=1.06$, the 5 SD param estimators are not statistically different at 90% significant level, leading to the conclusion that all of 5 SD parameters are equal.

The standardized residuals for the lognormal distribution can be calculated by $$\hat{e}_i = \frac{\ln(T_i) - \hat{\mu}'}{\hat{\sigma}'} \quad (25)$$

Figure 5:
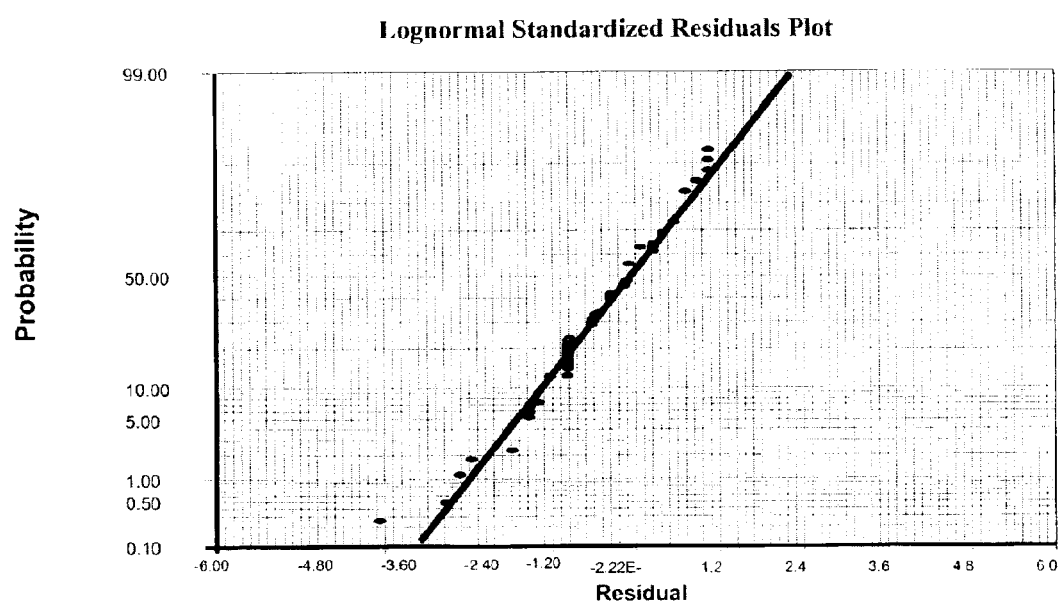
FIG. 5 shows standardized residuals for the fit of failure data from accelerated aging tests to a lognormal distribution on a normal probability plot.

Under the model, the standardized residuals should be normally distributed with a mean of zero and a standard deviation of one (~N(0,1)). FIG. 5 shows the standardized residuals for the lognormal distribution on a normal probability plot.

Figure 6:
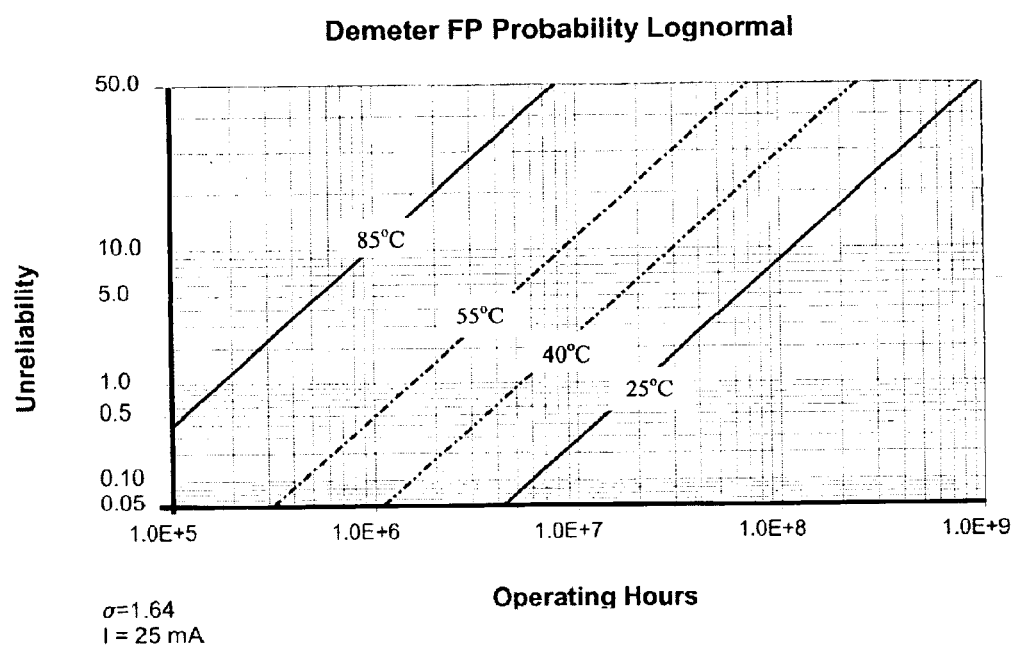
FIG. 6 shows standardized residuals for the fit of failure data from accelerated aging tests to a Weibull distribution on a normal probability plot.

Having determined the value of σ, reliability curves can be constructed showing the likelihood of failure as a function of time. FIG. 6 shows reliability predictions for typical application operating conditions based on the accelerated life model derived from the lognormal distribution fit to the failure data. The slope of each line corresponds to σ, so only one additional point must be specified to determine each reliability line. One way to select this point is by using the accelerated life model to determine the median time to failure, which corresponds to the time required for 50% of the laser diodes to fail.

Multivariable linear regression has also been used to determine parameters for an accelerated life model based on the fit of the failure data to the Weibull distribution. Note again that this analysis is based on the junction temperature of the laser. The junction temperature was determined using the relations $$P_D = [0.9 + 6*I]*I$$

$$T_j = T_a + P_D * \theta_j$$

Again, the thermal resistance was selected to be 200° C./W.

TABLE 3

Accelerated Life Model Using Weibull Distribution

| A | B | Ea | Acceleration Factor |
|---|---|---|---|
| 0.003 | 1.54 | 0.87 | A.F. = $(I_{f1}/I_{f2})^{1.54}$*exp(Ea/k *(1/$T_{j2}$ − 1/$T_{j1}$)) Where Ea = 0.87 eV |

The combination of A, B and Ea resulting in the best curve fit occurs when A=0.003, B=1.54 and Ea=0.87. Typical values of Ea for the most of these types of lasers are between 0.6 and 1. Based on the above, the predicted Median Life is:

$$\text{Median Life} = 0.003*(1/I)^{1.54}*\exp(Ea/k*(1/T)) \text{ where } Ea = 0.87 \text{ eV.}$$

Based on the collected failure data described above, fitting the data to a Weibull distribution resulted in a parameter value of β=0.89. To confirm that the shape parameter β of the lifetime distributions have the same value for each of the test conditions resulting in failures, the likelihood ratio (LR) test is applied. The LR test statistic is 0.87. Under the null hypothesis that all the β parameters are equal, the chi square distribution has 4 degrees of freedom. Since 0.87<$\chi^2$(1−90%, 4)=1.06, the 5 SD parameter estimators are not statistically different at 90% significant level, leading to the conclusion that all 5 of the SD parameters are equal.

The standardized residuals for the Weibull distribution can be calculated by $$\hat{e}_i = \hat{\beta}[\ln(T_i) - \ln(\hat{\eta})]$$

Figure 7:
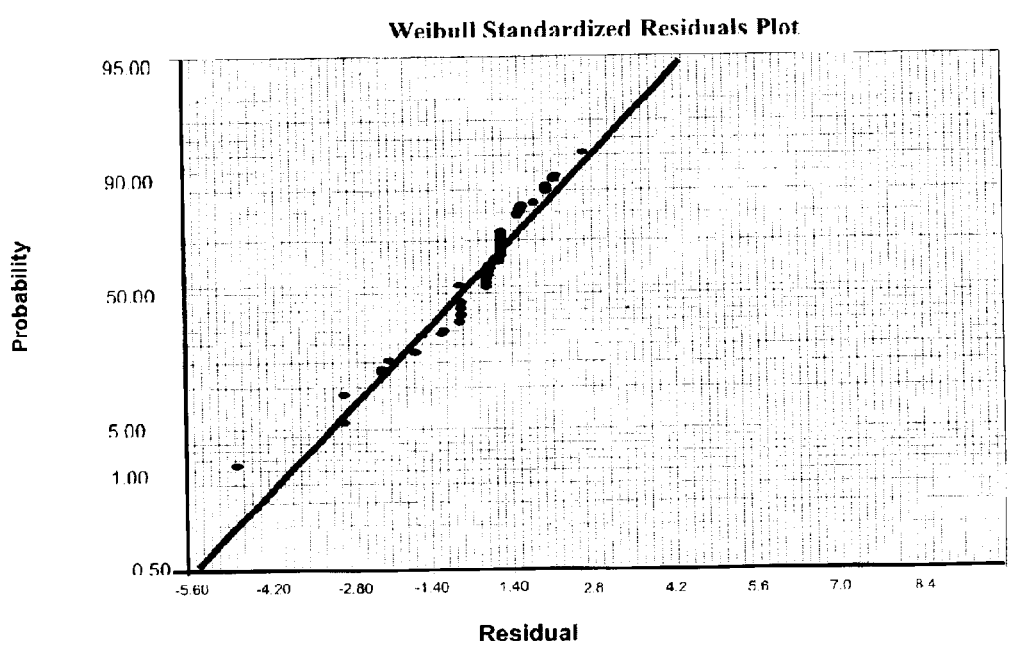
FIG. 7 depicts a plot of reliability predictions for typical laser operating conditions based on an accelerated life model derived from the lognormal distribution fit of failure data.

Under this model, the standardized residuals should follow a smallest extreme value distribution with a mean of zero. FIG. 7 shows the standardized residuals for the Weibull distribution on a smallest extreme value probability plot.

Figure 8:
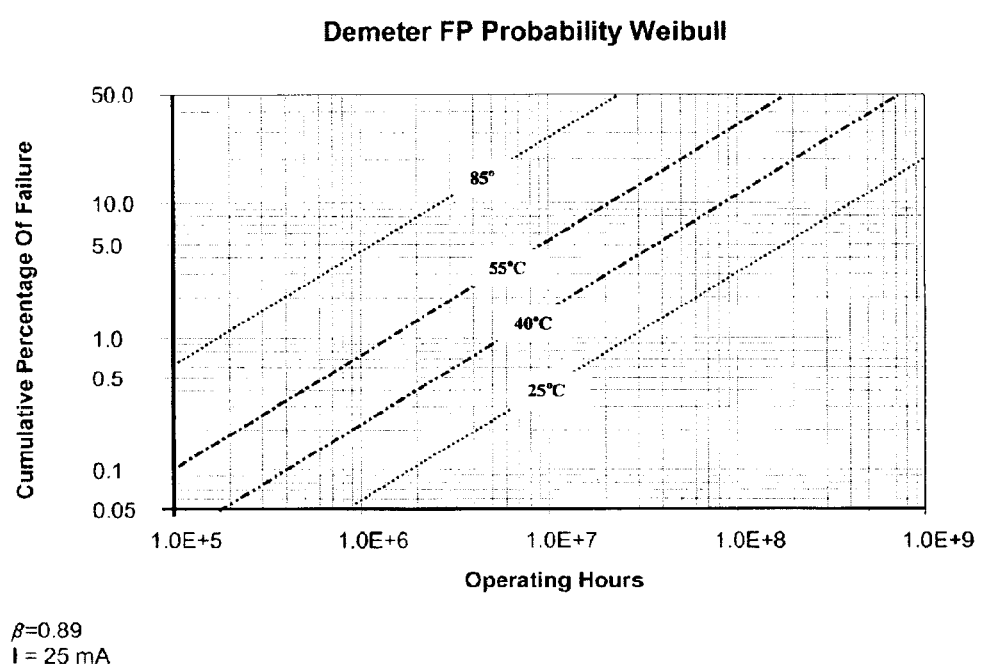
FIG. 8 depicts a plot of reliability predictions for typical laser operating conditions based on an accelerated life model derived from the Weibull distribution fit of failure data.

FIG. 8 shows reliability predictions for typical application operating conditions based on the accelerated life model derived from the Weibull distribution fit to the failure data. These reliability lines are constructed in the same manner as those in FIG. 6, with β now serving as the slope for each line.

The accelerated life model described above provides the expected failure rate versus lifetime behavior for a Demeter 1.3 μm FP laser diode. Once the parameters A, B, and Ea are determined, the model can be used to provide expected rates of failure for properly manufactured diodes operated at a given set operating current and temperature conditions for a specified length of time. Based on this model, the following working examples will demonstrate the application of an accelerated life model in a production environment.

Previous accelerated life testing results have determined that for a laser diode operating at 40° C. and 25 mA, the FIT (Failures per $10^9$ device hours) with 90% confidence is 13 or less, the cumulative failure rate in the first 2 years should be less than 0.007%, and the time required for failure of 1% of all devices is greater than 100 years.

Based on the accelerated life model for Demeter 1.3 μm FP laser diodes described above, a variety of alternative performance test conditions may be selected that will lead to equivalent burn-in, wafer qualification, and other performance test procedures. In an embodiment, alternative performance test conditions are selected in the following manner. First, a new set of operating conditions, including temperature and operating current, is selected. The accelerated life model is then used to determine the acceleration factor relative to a known set of performance test conditions. The test time at the known set of conditions is multiplied by the acceleration factor to yield the required performance test time at the new operating conditions. Having determined the acceleration factor, a reliability chart such as FIG. 6 or FIG. 8 is then consulted to determine the expected, failure rate at the new performance test conditions. The laser devices may pass the performance test at the new operating conditions by showing a cumulative failure rate that is lower than the expected failure rate at the new operating conditions.

For example, using the parameters determined above, the following tests provide equivalent performance test conditions that can be used to verify that manufactured devices will have a long-term reliability behavior of no worse than 13 FIT at 40° C. and 25 mA operation current: a) A 72 hours extended burn-in test at 100° C. and 150 mA, where the failure rate during the test is less than 0.0001%; or b) A 1000 hour long term aging test operating at 85° C. and 70 mA, where the failure rate is less than 0.03%. Thus, rather than developing empirical data to determine alternative burn-in and wafer qualification conditions at elevated temperatures and currents, the accelerated life model can be used to determine equivalent burn-in and wafer qualification conditions as a function of temperature and current.

In another example, previous empirical data suggests that Demeter 1.3 μm FP laser diodes may be adequately screened for infant mortality before packaging by using a burn-in procedure lasting 3 years under conditions of 40° C. and 25 mA. Based on the accelerated life model, an equivalent to this lengthy burn-in procedure is a burn-in procedure lasting only 20 hours under conditions of 100° C. and 150 mA. This equivalence may be found by determining the acceleration factor based on the equation provided in Table 3 above.

Those skilled in the art will recognize that inherent limitations in laser devices and other semiconductor devices restrict the range of temperatures and currents that may be selected during accelerated aging tests, burn-in procedures, and wafer qualification procedures. While the models may allow for prediction of equivalent burn-in and wafer qualification procedures with arbitrarily high temperatures and currents, excessive deviations from standard operating conditions may lead to failure mechanisms in the devices that are only present under extreme operating conditions. These practical considerations place an additional constraint on the selection of burn-in, wafer qualification, and other performance testing procedures. As a result, the method described here is useful for selecting performance testing procedures that operate in a minimum time without risking undue damage to devices.

While the above model has been described in connection with a particular laser diode, those skilled in the art will recognize the applicability of this methodology for other laser diodes or laser devices where reliability testing and lifetime determination are difficult due to long lifetimes and low failure rates.

We claim:

1. A method for performance testing comprising:
    providing a semiconductor laser, wherein said semiconductor laser is mounted to allow connection of said semiconductor laser to other circuitry;
    specifying a first set of performance test operating conditions, wherein said first set of performance test operating conditions includes a first performance test duration;

calculating a second set of performance test operating conditions based on an accelerated life model, wherein said second set of performance test operating conditions includes a second performance test duration; and performing a performance test on said semiconductor laser according to said second set of performance test operating conditions.

2. The method of claim 1, wherein the semiconductor laser is a laser diode.

3. The method of claim 1, wherein the accelerated life model is of the form

Median Life=$A*F(I)*\exp[Ea/(kT)]$ where I represents a drive current, T represents a junction temperature, A represents a process dependent constant, $E_a$ represents an activation energy (eV), and k represents Boltzmann's constant, $8.16171*10^{-5}$ eV per ° C.

4. The method of claim 3, wherein F(I) is of the form $F(I)(1/I)^B$ where B represent a drive current acceleration constant.

5. The method of claim 3, wherein calculating a second set of performance test operating conditions further comprises:

identifying a second operating current and a second operating temperature;

determining an acceleration factor based on the accelerated life model; and calculating the second performance test duration based on the acceleration factor and the first performance test duration.

6. The method of claim 1, wherein said performance test comprises a burn-in procedure.

7. The method of claim 1, wherein said performance test comprises a wafer qualification procedure.

8. A laser diode product produced by the method comprising:

providing a laser diode, wherein said laser diode is mounted to allow connection of said laser diode to other circuitry;

specifying a first set of performance test operating conditions, wherein said first set of performance test operating conditions includes a first performance test duration;

calculating a second set of performance test operating conditions based on an accelerated life model, wherein said second set of performance test operating conditions includes a second performance test duration; and performing a performance test on said laser diode according to said second set of performance test operating conditions.

9. The laser diode product of claim 8, wherein the performance test comprises a burn-in procedure.

10. The laser diode product of claim 8, wherein the accelerated life model is of the form Median Life=$A*F(I)*\exp[Ea/(kT)]$ where I represents a drive current, T represents a junction temperature, A represents a process dependent constant, $E_a$ represents an activation energy (eV), and k represents Boltzmann's constant, $8.16171*10^{-5}$ eV per ° C.

11. The laser diode product of claim 3, wherein F(I) is of the form $F=(I)(1/I)^B$ where B represent a drive current acceleration constant.

12. The laser diode product of claim 10, wherein calculating a second set of performance test operating conditions further comprises:

identifying a second operating current and a second operating temperature;

determining an acceleration factor based on the accelerated life model; and calculating the second performance test duration based on the acceleration factor and the first performance test duration.

* * * * *

UNITED STATES PATENT AND TRADEMARK OFFICE
CERTIFICATE OF CORRECTION

PATENT NO.       : 6,977,517 B2
APPLICATION NO.  : 10/440743
DATED            : December 20, 2005
INVENTOR(S)      : Miao et al.

It is certified that error appears in the above-identified patent and that said Letters Patent is hereby corrected as shown below:

Column 5
Line 33, after "mounting" insert --,--

Column 7
Line 60, change "increasing" to --increase--

Column 11
Line 53, change "Ea" to --$E_a$--
Line 53, change "(3)" to --(1)--

Column 12
Table 2, change "A.F. = $(I_{f1}/I_{f2})^{1.67}$*exp(Ea/k*(1/$T_{j2}$ — 1/$T_{j1}$))" to --A.F. = $(I_{f1}/I_{f2})^{1.67}$*exp($E_a$/k*(1/$T_{j2}$ - 1/$T_{j1}$))--
Table 2, change "Ea = 0.76" to --$E_a$ = 0.76--
Line 11, change "Ea" to --$E_a$--
Line 12, change "Ea" to --$E_a$--
Line 13, change "Ea" to --$E_a$--
Line 14, change "Tthe" to --the--
Line 16, change "Median Life=0.05*$(1/I)^{1.67}$*exp(Ea/k *(1/T)) where Ea=0.76 eV." to --Median Life=0.05*$(1/I)^{1.67}$*exp($E_a$/k *(1/T)) where $E_a$=0.76 eV.--

Column 13
Table 3, change "A.F. = $(I_{f1}/I_{f2})^{1.54}$*exp(Ea/k *(1/$T_{j2}$ — 1/$T_{j1}$))" to --A.F. = $(I_{f1}/I_{f2})^{1.54}$*exp($E_a$/k *(1/$T_{j2}$ — 1/$T_{j1}$))--
Table 3, change "Where Ea = 0.87 eV" to --Where $E_a$ = 0.87 eV--
Line 17, change "Ea" to --$E_a$--
Line 18, change "Ea" to --$E_a$--
Line 19, change "Ea" to --$E_a$--

UNITED STATES PATENT AND TRADEMARK OFFICE
CERTIFICATE OF CORRECTION

PATENT NO. : 6,977,517 B2
APPLICATION NO. : 10/440743
DATED : December 20, 2005
INVENTOR(S) : Miao et al.

It is certified that error appears in the above-identified patent and that said Letters Patent is hereby corrected as shown below:

Line 22, change "Median Life=0.003*(1/I)$^{1.54}$*exp(Ea/k8(1/T)) where Ea=0.87 eV" to --Median Life=0.003*(1/I)$^{1.54}$*exp($E_a$/k8(1/T)) where $E_a$=0.87 eV--
Line 32, change "SD" to --β--
Line 32, change "SD" to --β--
Line 51, change "Ea" to --$E_a$--

Column 14
Line 10, after "expected" remove [,]
Line 19, change "hours" to --hour--

Column 15
Line 13, change "Median Life=A*F(I)*exp[Ea/(kT)]" to --Median Life=A*F(I)*exp[$E_a$/(kT)]--
Line 21, change "F(I)(1/I)$^B$" to --F(I)=(1/I)$^B$--
Line 22, change "represent" to --represents--

Column 16
Line 18, change "Median Life=A*F(I)*exp[Ea/(kT)]" to --Median Life=A*F(I)*exp[$E_a$/(kT)]--
Line 24, change "claim 3" to --claim 10--
Line 27, change "F=(I)(1/I)$^B$" to --F(I)=(1/I)$^B$--

Signed and Sealed this

Sixth Day of May, 2008

JON W. DUDAS
*Director of the United States Patent and Trademark Office*